United States Patent
Isbell et al.

(10) Patent No.: US 6,305,972 B1
(45) Date of Patent: Oct. 23, 2001

(54) APPARATUS FOR MOUNTING AN ELECTRONIC COMPONENT TO A PRINTED CIRCUIT BOARD

(75) Inventors: James Lee Isbell, Phoenix; Jay Robert Mitchell, Mesa; Mathew Ronald Michieli, Gilbert, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/610,770

(22) Filed: Jul. 6, 2000

(51) Int. Cl.[7] ........................................................ H01R 3/00
(52) U.S. Cl. .............................................. 439/500; 361/767
(58) Field of Search ................................. 439/500, 62, 56

(56) References Cited

U.S. PATENT DOCUMENTS

| | | | |
|---|---|---|---|
| 4,863,389 | * | 9/1989 | Kobari et al. ............................ 439/83 |
| 5,431,575 | * | 7/1995 | Engica .................................. 439/218 |
| 5,505,629 | * | 4/1996 | Majima et al. ......................... 439/78 |
| 5,707,249 | * | 1/1998 | Byrd ..................................... 439/500 |
| 5,749,737 | * | 5/1998 | Zuin ..................................... 439/500 |
| 5,839,189 | * | 11/1998 | Pomeroy et al. ....................... 29/839 |
| 5,863,674 | * | 1/1999 | Yamanaka ............................. 429/100 |
| 6,141,223 | * | 10/2000 | Fukushima ............................ 361/781 |

* cited by examiner

Primary Examiner—Paula Bradley
Assistant Examiner—Ann McCamey
(74) Attorney, Agent, or Firm—Michael C. Soldner

(57) ABSTRACT

An apparatus (20) for mounting an electronic component (30) to a print circuit board (40), wherein the electronic component (30) has a positive lead (32) and negative lead (34). The mounting apparatus (20) includes a positive contact plate (50) having a component contact (54) and PCB contact (56), wherein the component contact (54) and the PCB contact (56) are connected with and extending from the positive contact plate (50). The mounting apparatus also includes a negative contact plate (60) having a component contact (64) and a PCB contact (66), wherein the component contact (64) and the PCB contact (66) are connected with and extending from the negative contact plate (60). The mounting apparatus (20) further includes a captivating member (75) connected with and extending from one of the positive contact plate (50) and the negative contact plate (60), and an insulating member (70) located between the positive contact plate (50) and the negative contact plate (60) for preventing electrical current from traveling from the positive contact plate (50) to the negative contact plate (60).

20 Claims, 2 Drawing Sheets

US 6,305,972 B1

APPARATUS FOR MOUNTING AN ELECTRONIC COMPONENT TO A PRINTED CIRCUIT BOARD

FIELD OF THE INVENTION

This invention relates, in general, to an electronic package assembly and, more particularly, to an electronic package assembly for mounting electronic components to a printed circuit board, wherein the electronic package assembly includes integrated electrical contacts.

BACKGROUND OF THE INVENTION

Printed circuit boards have numerous electronic components mounted to them, such as resistors, capacitors, and microchips. Typically, in order to ease the installation of these electronic components onto the printed circuit board, an electronic package assembly is manufactured which houses the electronic component. The electronic package assembly is then used to mount the electronic component onto the printed circuit board. A specific example of such a packaged electronic component is an accelerometer, which may, for example, be mounted on a printed circuit board used in automobiles to activate an airbag, for instance.

Another example of a packaged electronic component is a large capacitor, which may, for example, be mounted on a printed circuit board used in cellular or satellite phones to store electrical charge. As defined herein, a large capacitor is any capacitor having a voltage rating of about 4 volts to about 33 volts, a capacitance rating of about 1500 $\mu F$ to about 7000 $\lambda F$, or a size of about 4 cubic centimeters to about 8 cubic centimeters. Any other capacitor will be referred to as a "capacitor" herein.

Typically, large capacitors are mounted to a printed circuit board using an electronic package assembly having a metal bracket and a flexible circuit with solder connections for electrical connectivity. The large capacitors must be fastened to the metal bracket and the metal bracket is then attached to the printed circuit board by either soldering the bracket to the board or by fasting the bracket to the printed circuit board with metal screws. Once the metal bracket and the large capacitor are fastened to the printed circuit board, the large capacitor must be electrically connected to the printed circuit board by utilizing a flexible circuit with solder connections.

Another way of mounting large capacitors to a printed circuit board is by utilizing an electronic package assembly having a rubber boot for mounting and a printed circuit board with pogo-pin style connectors for electrical connectivity. The large capacitor is encapsulated in the rubber boot and then the rubber boot is mounted onto the printed circuit board. Next, the large capacitor is electrically connected to the printed circuit board through the pogo-pin style connectors and a printed circuit board contact system. Both of the above electronic package assemblies require that the large capacitor be secured onto the electronic package assembly, that the electronic package assembly be mounted on the printed circuit board, and then that the large capacitor be electrically connected to the printed using connectors which are separate and apart from the electronic package assembly.

Installing a large capacitor onto a printed circuit board using the above disclosed electronic package assemblies is not a simple task and can be rather cumbersome. For example, connecting the large capacitor to the printed circuit board using solder connections requires a substantial amount of time and labor. Additionally, forcing the capacitor into a rubber boot and then installing pogo pin style connectors onto the printed circuit board in order to electrically connect the large capacitor to the printed circuit board also requires a substantial amount of time and labor. Accordingly, further development of electronic package assemblies, and in particular electronic package assemblies for mounting electrical components such as large capacitors to printed circuit boards is necessary to save time and labor during the installation of these electronic components.

BRIEF DESCRIPTION OF THE DRAWINGS

The features of the present invention which are believed to be novel are set forth with particularity in the appended claims. The invention, together with further objects and advantages thereof, may best be understood by making reference to the following description, taken in conjunction with the accompanying drawings, in the several figures of which like reference numerals identify like elements, and wherein:

It will be appreciated that for simplicity and clarity of illustration, elements shown in the figures have not necessarily been drawn to scale. For example, dimensions of some elements are exaggerated relative to each other.

DETAILED DESCRIPTION OF THE INVENTION

In view of the above limitations of existing mounting apparatus, it is an aspect of the present invention to provide an apparatus for mounting an electronic component to a printed circuit board, wherein the electronic component has a positive lead and negative lead. The mounting apparatus includes a positive contact plate having a component contact and PCB contact, wherein the component contact and the PCB contact are connected with and extending from the positive contact plate. The mounting apparatus also includes a negative contact plate having a component contact and a PCB contact, wherein the component contact and the PCB contact are connected with and extending from the negative contact plate. The apparatus further includes a captivating member connected with and extending from one of the positive contact plate and the negative contact plate, and an insulating member located between the positive contact plate and the negative contact plate for preventing electrical current from traveling from the positive contact plate to the negative contact plate.

According to a preferred embodiment of the present invention, the mounting apparatus further includes a first snap-fit flange extended from the positive contact plate, and a second snap-fit flange extended from the negative contact plate, wherein the first and second snap-fit flanges are adapted to connect with the insulating member for snap-fit assembly of the mounting apparatus.

Figure 1:
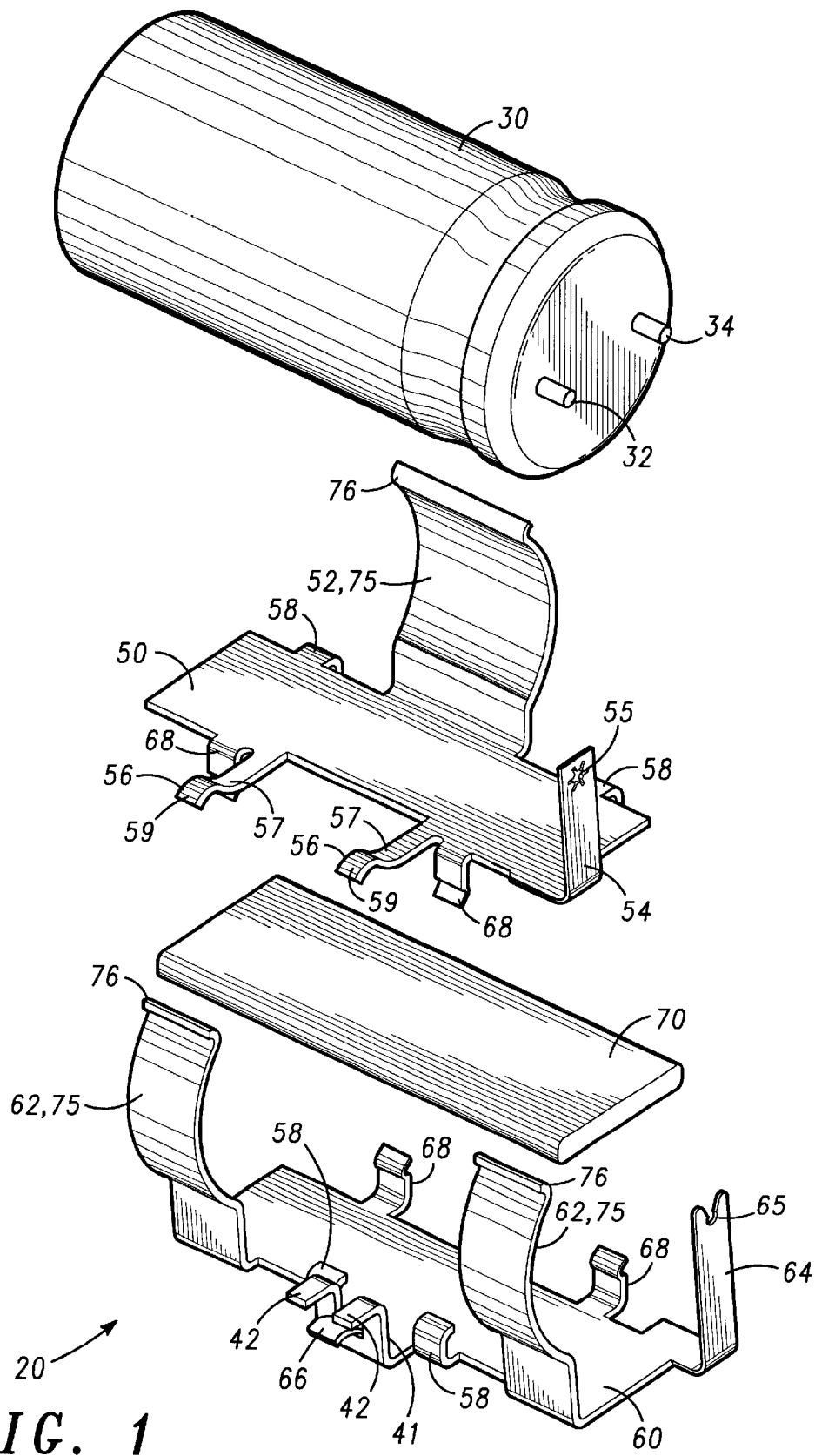
FIG. 1 is an exploded perspective view of a mounting apparatus for mounting an electronic component to a printed circuit board, according to the present invention.

Shown in FIG. 1 is an exploded perspective view of a mounting apparatus 20 for use in mounting an electronic component 30 to a printed circuit board 40 (FIG. 2) according to the present invention. Electronic component 30 can include any electronic component having a positive lead 32 and a negative lead 34, such as, for example, a battery, a capacitor, a large capacitor, a resistor, a semiconductor chip, a diode, an inductor, and a coil. Positive lead 32 allows for the flow of electrons from electronic component 30, while negative lead 34 allows for the flow of electrons to the electronic component 30. Printed circuit board 40 is a typical printed circuit board manufactured from any one of a number of materials known to one of ordinary skill in the art, such as epoxy glass, FR4, and polyamide. Typically, printed circuit board 40 has a number of electrical components 30 mounted on the surface of printed circuit board 40. These electrical components 30 are electrically connected to each other through a number of lands (not shown) and traces (not shown) printed on the surface and the internal layers of printed circuit board 40.

Mounting apparatus 20 includes a positive contact plate 50, a negative contact plate 60, a captivating member 75 and an insulating member 70, as illustrated in FIG. 1. Positive contact plate 50 includes a component contact 54 and a PCB contact 56. Positive contact plate 50 is manufactured from materials that are rigid enough to form elements such as component contact 54 and PCB contact 56 and that allow the flow of electrons such as, beryllium copper, spring steel, copper, gold plated metal, silver, or any metal. According to a preferred embodiment of the present invention, positive contact plate 50 is formed from a single flat sheet of metallic material. By forming positive contact plate 50 from a single flat sheet of metal, elements such as component contact 54 and PCB contact 56 can be formed relatively inexpensively through a die cut or stamping process. Alternatively, positive contact plate 50 may be formed using any technique known to one of ordinary skill, such as die casting, injection molding, or brazing. Component contact 54 and PCB contact 56 are connected with and extending from the positive contact plate 50. Preferably, component contact 54 and PCB contact 56 are integrally formed with positive contact plate 50, however, component contact 54 and PCB contact 56 may be separately formed and then later attached to or connected with positive contact plate 50. Whichever way component contact 54, PCB contact 56, and positive contact plate 50 are formed, eventually component contact 54, PCB contact 56, and positive contact plate 50 are all integrated into one single unit.

Component contact 54 is designed to extend from positive contact plate 50 towards positive lead 32. At one end, component contact 54 is electrically connected with positive contact plate 50 and at the other end component contact 54 is designed to be electrically connected with positive lead 32. Preferably, component contact 54 is electrically connected with positive lead 32 through an opening 55. Opening 55 is designed so that positive lead 32 may be inserted into opening 55 and connected with component contact 54. Preferably, the edges of opening 55 are designed to come into contact with the surface of positive lead 32, in this way, positive lead 32 is electrically connected with component contact 54 which is subsequently electrically connected with positive contact plate 50. Component contact 54 may be electrically connected to positive lead 32 in any one of a number of ways known to one of ordinary skill in the art.

Figure 3:
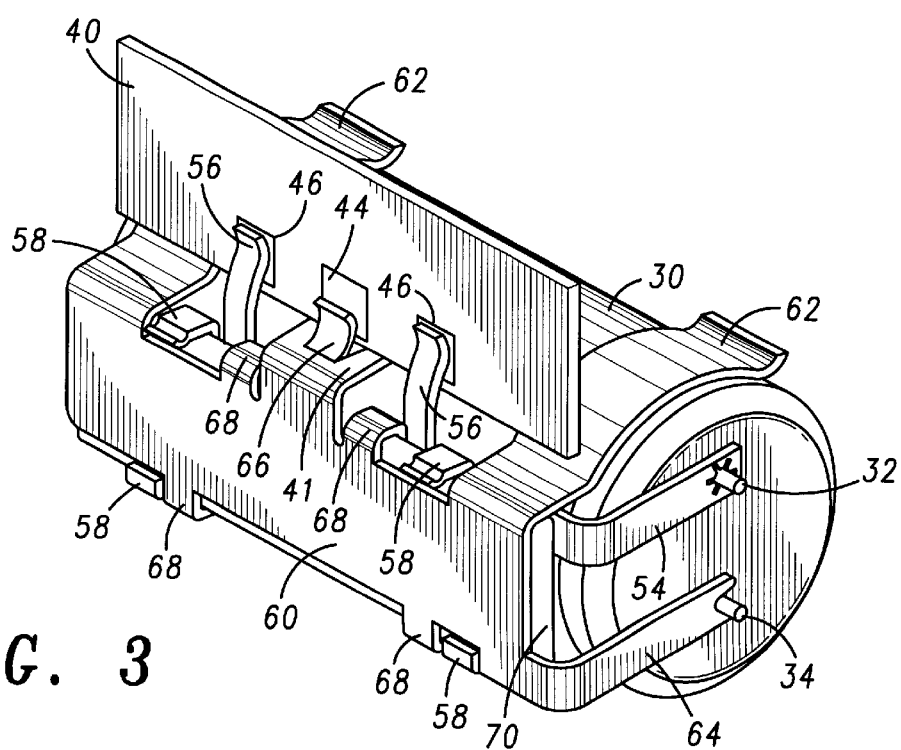
FIG. 3 is another perspective view of the mounting apparatus shown in FIG. 2, according to the present invention.

PCB contact 56 extends outwards and away from positive contact plate 50, as illustrated in FIGS. 1 and 3. PCB contact 56 is electrically connected with and extending from positive contact plate 50 at one end and is designed to be electrically connected with the positive contact 46 of printed circuit board 40, as illustrated in FIG. 3. Preferably, PCB contact 56 includes fold 57 and contact area 59. Fold 57 is located between positive contact plate 50 and contact area 59 on PCB contact 56. Fold 57 causes contact area 59 to press against printed circuit board 40 when printed circuit board 40 is attached to mounting apparatus 20. Preferably, contact area 59 is formed with a slight curve so as to allow contact area 59 to come into contact with positive contact 46 of printed circuit board 40 at a precise location.

Negative contact plate 60 includes a component contact 64 and a PCB contact 66. Negative contact plate 60 is manufactured from materials that are rigid enough to form elements such as component contact 64 and PCB contact 66 and that allow the flow of electrons such as, beryllium copper, spring steel, copper, gold plated metal, silver, or any metal. According to a preferred embodiment of the present invention, negative contact plate 60 is formed from a single flat sheet of metallic material. By forming negative contact plate 60 from a single flat sheet of metal, elements such as component contact 64 and PCB contact 66 can be formed relatively inexpensively through a die cut or stamping process. Alternatively, negative contact plate 60 may be formed using any technique known to one of ordinary skill, such as die casting, injection molding, or brazing. Component contact 64 and PCB contact 66 are electrically connected with and extending from the negative contact plate 60. Preferably, component contact 64 and PCB contact 66 are integrally formed with negative contact plate 60, however, component contact 64 and PCB contact 66 may be separately formed and then later attached to or connected with negative contact plate 60. However component contact 64, PCB contact 66, and negative contact plate 60 are formed, eventually, component contact 64, PCB contact 66, and negative contact plate 60 are integrated into one single unit.

Component contact 64 is designed to extend from negative contact plate 60 towards negative lead 34. At one end component contact 64 is electrically connected with negative contact plate 60 and at the other end component contact 64 is designed to be electrically connected with negative lead 34. Component contact 64 is designed to be electrically connected with electronic component 30 independently from component contact 54. Preferably, component contact 64 is designed to be electrically connected with negative lead 34 through notch 65. Notch 65 is designed so that negative lead 34 may be rest on top of notch 65 and become electrically connected with component contact 64. Preferably, the edges of notch 65 are designed to come into direct electrical contact with the surface of negative lead 34. In this way, negative lead 34 is electrically connected with component contact 64 which is subsequently electrically connected with negative contact plate 60. Component contact 64 may be electrically connected to negative lead 34 in any one of a number of ways known to one of ordinary skill in the art. While in the above embodiments, component contact 64 is electrically connected with negative lead 34 through notch 65, component contact 64 may be electrically connected with negative lead 34 through an opening such as opening 55. Moreover, while in the above embodiments, component contact 54 is electrically connected with positive lead 32 through opening 55, component contact 54 may be electrically connected with positive lead 32 through a notch, such as notch 65.

PCB contact 66 extends outwards and away from negative contact plate 60, as illustrated in FIGS. 1 and 3. PCB contact 66 is connected with and extending from negative contact plate 60 at one end and is designed to be electrically connected with the negative contact 44 of printed circuit board 40, as illustrated in FIG. 3. Preferably, PCB contact 66 is folded or bent so that PCB contact 66 presses against negative contact 44 of printed circuit board 40 when printed circuit board 40 is attached to mounting apparatus 20. Preferably, a portion of PCB contact 66 is formed with a slight curve so as to allow PCB contact 66 to come into contact with negative contact 44 of printed circuit board 40 at a precise location.

Figure 2:
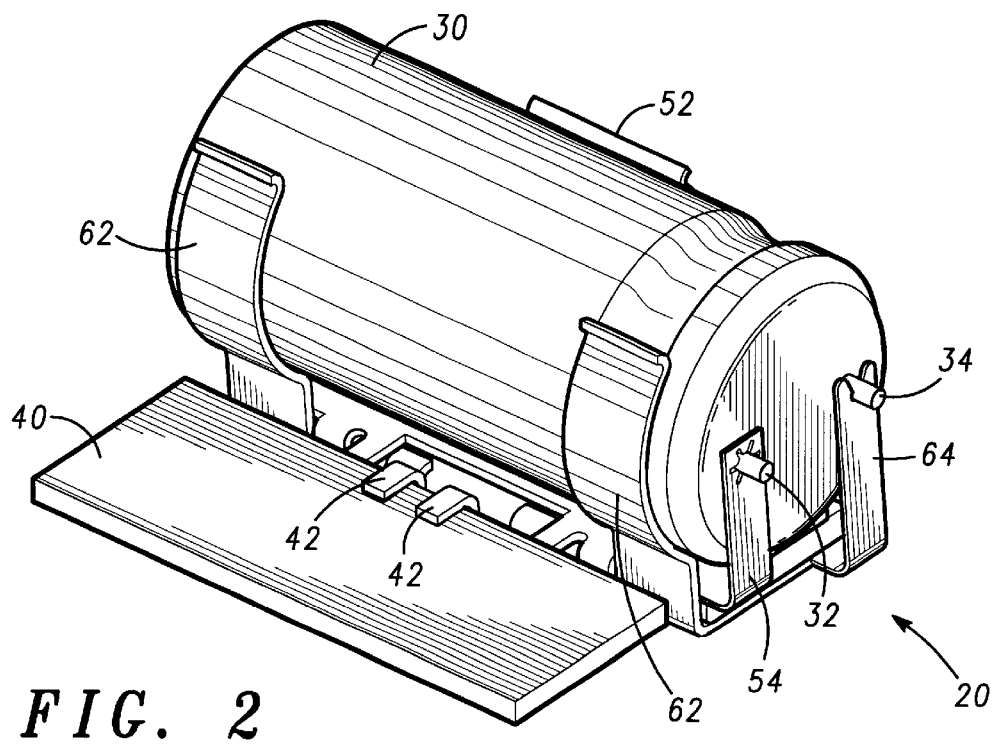
FIG. 2 is a perspective view of a mounting apparatus shown in FIG. 1 attached to a printed circuit board, according to the present invention.

Captivating member 75 is connected with and extends outwards from at least one of the positive contact plate 50 and the negative contact plate 60, as illustrated in FIGS. 1–3. Preferably, one captivating member 75 is connected to positive contact plate 50 and a second captivating member 75 is connected to negative contact plate 60. In a preferred embodiment of he present invention, two captivating members 75 are connected to negative contact plate 60, as illustrated in FIG. 1. Preferably, captivating member 75 is adapted to secure electronic component 30 to the mounting apparatus 20 by conforming to the shape of electronic component 30, as illustrated in FIG. 1. Captivating member 75 may be any device or member which can secure electronic component 30 to mounting apparatus 20, such as two curved plates and a screw, a belt, a hook and loop type fastener, a cable, a spring such as captivating spring 52, 62, or any other device that can be used to secure an electronic component 30 to a metal plate such as positive contact plate 50 or negative contact plate 60.

According to a preferred embodiment of the present invention, captivating member 75 is a captivating spring 52, 62 as illustrated in FIG. 1. Captivating spring 52, 62 includes curved portion 76 at one end and is attached to positive contact plate 50 or negative contact plate 60 at the other end. Curved portion 76 allows electronic component 30 to more easily be attached to and secured by captivating spring 52, 62 in order to simplify the installation of electronic component 30.

Insulating member 70 is located between positive contact plate 50 and negative contact plate 60. Insulating member 70 can be manufactured from any known material that prevents the flow of electrons, such as standard PCB substrate, FR4, polymer, or phenolic. Insulating member 70 electrically insulates positive contact plate 50 and negative contact plate 60 from each other so as to allow electrical current to pass through positive contact plate 50 and negative contact plate 60 without causing a short. Preferably, insulating member 70 is attached to at least one of positive contact plate 50 and negative contact plate 60 and is located between positive contact plate 50 and negative contact plate 60. Insulating member 70 may be attached to at least one of positive contact plate 50 and negative contact plate 60 by any type of coupling mechanism known by those skilled in the art such as, for example, a clip, a clamp, a magnet with a strip of glue on at least one side, a hook and loop type fastener (such as a strip of VELCRO™), a snap-fit arrangement, glue, heat staking, or any other comparable coupling mechanism or method which allows insulating member 70 to be secured to one of positive contact plate 50 and negative contact plate 60.

According to a preferred embodiment of the present invention, insulating member 70 is secured to both positive contact plate 50 and negative contact plate 60 through a snap-fit arrangement. In this embodiment, mounting apparatus 20 includes a first set of snap-fit flanges 58, 68 extending from the positive contact plate 50, and a second set of snap-fit flanges 58, 68 extending from the negative contact plate 60, wherein the first and second sets of snap-fit flanges 58, 68 are adapted to connect with the insulating member 70 for snap-fit assembly of the mounting apparatus 20, as illustrated in FIG. 1. Preferably, snap-fit flanges 58 are u-shaped while snap-fit flanges 68 are generally curved so as to allow negative contact plate 60 and positive contact plate 50 to more easily snap onto and become secured to insulating member 70, as illustrated in FIGS. 1–3.

According to a preferred embodiment of the present invention, mounting apparatus 20 includes a PCB connecting member 41 connected to at least one of the positive contact plate 50 and the negative contact plate 60. As shown in FIGS. 1–3, the PCB connecting member 41 is connected to negative contact plate 60. PCB connecting member 41 is adapted to secure the printed circuit board 40 to the mounting apparatus 20. PCB connecting member 41 may be generally any type of coupling mechanism known to those skilled in the art such as, for example, an alligator clip, a clamp, a magnet, a hook and loop type fastener (such as a strip of VELCRO™), a snap-fit arrangement or any other comparable coupling mechanism or method which allows printed circuit board 40 to be secured to mounting apparatus 20. In one preferred embodiment, PCB connecting member 41 is a snap-fit fit arrangement and includes at least one connecting flange 42. Preferably, PCB connecting member 41 includes two connecting flanges 42 arranged in spaced apart relation above PCB contact 66 so that printed circuit board fits between and is secured by connecting flanges 42 and PCB contact 66, as illustrated in FIGS. 2–3.

As described above, positive contact plate 50 allows for the flow of positive electrons and negative contact plate 60 allows for the flow of negative electrons. However, it will be recognized by those skilled in the art that positive contact plate 50 may allow for the flow of negative electrons and that negative contact plate 60 may allow for the flow of positive electrons. Moreover, it will be recognized by those skilled in the art that there are many alternative configurations for positive contact plate 50 and negative contact plate 60. For example, positive contact plate 50 may include two captivating members 75 and that negative contact plate 60 may include only one captivating member 75. Moreover, positive contact plate 50 may include component contact 64 and negative contact plate 60 may include component contact 54.

In one preferred embodiment, mounting apparatus 20 is assembled by utilizing a snap-fit assembly and by pressing together positive contact plate 50 and insulating member 70, as illustrated in FIGS. 1–3. However, positive contact plate 50 may be attached to insulating member 70 in any one of a number of ways, as described above. Upon attaching positive contact plate 50 to insulating member 70, negative contact plate 60 is attached to insulating member 70. Preferably, a snap-fit assembly is utilized and negative contact plate 60 is pressed together with insulating member 70. Once positive contact plate 50, negative contact plate 60, and insulating member 70 are attached to each other, positive lead 32 and negative lead 34 are electrically connected with component contacts 54 and 64, respectively, and electronic component 30 is then secured onto mounting apparatus 20. Also, once positive contact plate 50, negative contact plate 60, and insulating member 70 are attached to each other, printed circuit board 40 is secured to and electrically connected with mounting apparatus 20 by securing printed circuit board 40 to PCB connecting member 41. In one preferred embodiment, printed circuit board 40 is secured to and electrically connected with mounting apparatus 20 by placing printed circuit board 40 between connecting flanges 42 and PCB contact 66, as illustrated in FIGS. 2–3.

Thus, it is apparent that there has been provided, in accordance with the invention, a mounting apparatus for mounting an electronic component to a printed circuit board that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention.

What is claimed is:

1. An apparatus for mounting an electronic component to a printed circuit board the electronic component having a positive lead and a negative lead, the apparatus comprising:
    a positive contact plate having a component contact and a PCB contact, wherein the component contact and the PCB contact are connected with and extending from the positive contact plate;
    a negative contact plate having a component contact and a PCB contact, wherein the component contact and the PCB contact are connected with and extending from the negative contact plate;
    a captivating member connected with and extending outwards from one of the positive contact plate and the negative contact plate; and
    an insulating member located between the positive contact plate and the negative contact plate for preventing electrical current from traveling from the positive contact plate to the negative contact plate.

2. The mounting apparatus of claim 1 further comprising:
    a first snap-fit flange extending from the positive contact plate; and
    a second snap-fit flange extending from the negative contact plate, wherein the first and second snap-fit flanges are adapted to connect with the insulating member for snap-fit assembly of the mounting apparatus.

3. The mounting apparatus of claim 1 wherein the positive contact plate and the negative contact plate are each formed of a single sheet of conductive material.

4. The mounting apparatus of claim 1, further comprising a second captivating member connected to and extending outwards from one of the positive contact plate and the negative contact plate, wherein the first and second captivating members are adapted to secure the electronic component to the mounting apparatus.

5. The mounting apparatus of claim 1, wherein the printed circuit board comprises a negative contact and a positive contact, and wherein the PCB contact is connected to the positive contact of the printed circuit board and the PCB contact is connected to the negative contact of the printed circuit board.

6. The mounting apparatus of claim 1, wherein the electronic component and the printed circuit board are removably connected to the mounting apparatus.

7. An apparatus for mounting a capacitor having positive and negative leads to a printed circuit board having positive and negative contacts, the apparatus comprising:
    a positive contact plate having a first captivating member connected to and extending outwards from the positive contact plate, the first captivating member adapted to secure at least a portion of the capacitor to the positive contact plate, a component contact connected to and extending outwards from the positive contact plate, the component contact adapted to connect the positive lead of the capacitor to the positive contact plate, and a PCB contact connected to and extending outwards from the positive contact plate, the PCB contact adapted connect the positive contact of the printed circuit board to the positive contact plate;
    a negative contact plate having a second captivating member connected to and extending outwards from the negative contact plate, the second captivating member adapted to secure at least a portion of the capacitor to the negative contact plate, a component contact connected to and extending outwards from the negative contact plate, the component contact adapted to connect the negative lead of the capacitor to the negative contact plate, and a PCB contact connected to and extending outwards from the negative contact plate, the PCB contact adapted connect the negative contact of the printed circuit board to the negative contact plate; and
    an insulating member located between the positive contact plate and the negative contact plate for preventing electrical current from traveling from the positive contact plate to the negative contact plate.

8. The mounting apparatus of claim 7 further comprising:
    a first snap-fit flange extending from the positive contact plate towards the negative contact plate; and
    a second snap-fit flange extending from the negative contact plate towards the positive contact plate, wherein the first and second snap-fit flanges are adapted to connect with the insulating member for snap-fit assembly of the mounting apparatus.

9. The mounting apparatus of claim 7 wherein the positive contact plate and the negative contact plate are each formed of a single sheet of conductive material.

10. The mounting apparatus of claim 7 further comprising a PCB connecting member connected to at least one of the positive contact plate and the negative contact plate, wherein the PCB connecting member is adapted to secure the printed circuit board to the mounting apparatus.

11. The mounting apparatus of claim 10, wherein the PCB connecting member includes at least one PCB flange and at least one PCB contact.

12. The mounting apparatus of claim 7, wherein the capacitor and the printed circuit board are removably connected to the mounting apparatus.

13. The mounting apparatus of claim 7, wherein the capacitor is a large capacitor.

14. An apparatus for mounting an electronic component having positive and negative leads to a printed circuit board having positive and negative contacts, the apparatus comprising:
    a positive contact plate having a component contact connected to and extending away from the positive contact plate, and a PCB contact connected to and extending away from the positive contact plate, wherein the component contact is adapted for connection to the positive lead and the PCB contact is adapted for connection to the positive contact of the printed circuit board;
    a negative contact plate having a component contact connected to and extending away from the negative contact plate, and a PCB contact connected to and extending away from the negative contact plate, wherein the component contact is adapted for connection to the negative lead and the PCB contact is adapted for connection to the negative contact of the printed circuit board;
    a captivating member connected to at least one of the positive contact plate and the negative contact plate, wherein the captivating member is adapted to secure the electronic component to the mounting apparatus; and an insulating member located between the positive contact plate and the negative contact plate for preventing electrical current from traveling from the positive contact plate to the negative contact plate.

15. The mounting apparatus of claim 14 further comprising:
   a first snap-fit flange extending from the positive contact plate; and
   a second snap-fit flange extending from the negative contact plate, wherein the first and second snap-fit flanges are adapted to connect with the insulating member for snap-fit assembly of the mounting apparatus.

16. The mounting apparatus of claim 14 further comprising a PCB connecting member connected to at least one of the positive contact plate and the negative contact plate, wherein the PCB connecting member is adapted to secure the printed circuit board to the mounting apparatus.

17. The mounting apparatus of claim 14, wherein the electronic component and the printed circuit board are removably connected to the mounting apparatus.

18. The mounting apparatus of claim 14, wherein the electronic component is a large capacitor.

19. An apparatus for mounting an electronic component having positive and negative leads to a printed circuit board having positive and negative contacts, the apparatus comprising:

a positive contact member having a component contact means for connecting the positive contact member to the positive lead, and a PCB contact means for connecting the positive contact member to the positive contact of the printed circuit board;

a negative contact member having a component contact means for connecting the negative contact member to the negative lead, and a PCB contact means for connecting the negative contact member to the negative contact of the printed circuit board;

captivating means for securing the electronic component to the mounting apparatus; and an insulating means located between the positive contact member and the negative contact member for preventing electrical current from traveling from the positive contact plate to the negative contact plate.

20. The mounting apparatus of claim 19 further comprising PCB connecting means for securing the printed circuit board to the mounting apparatus.

* * * * *